United States Patent
Butcher et al.

(10) Patent No.: US 6,806,127 B2
(45) Date of Patent: Oct. 19, 2004

(54) METHOD AND STRUCTURE FOR CONTACTING AN OVERLYING ELECTRODE FOR A MAGNETOELECTRONICS ELEMENT

(75) Inventors: Brian R. Butcher, Gilbert, AZ (US);
Kenneth H. Smith, Chandler, AZ (US);
Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 2 days.

(21) Appl. No.: 10/309,514

(22) Filed: Dec. 3, 2002

(65) Prior Publication Data

US 2004/0106245 A1 Jun. 3, 2004

(51) Int. Cl.[7] .................. H01L 21/336; H01L 21/8234
(52) U.S. Cl. .................. 438/197; 438/257; 438/303
(58) Field of Search ............................. 438/197, 257, 438/265, 303, 304

(56) References Cited

U.S. PATENT DOCUMENTS

| | | |
|---|---|---|
| 3,984,815 A | 10/1976 | Drexler et al. |
| 4,805,146 A | 2/1989 | Bruder et al. |
| 5,640,343 A | 6/1997 | Gallagher et al. |
| 5,793,697 A | 8/1998 | Scheuerlein |
| 6,055,178 A | 4/2000 | Naji |
| 6,081,446 A | 6/2000 | Brug et al. |
| 6,097,626 A | 8/2000 | Brug et al. |
| 6,111,783 A | 8/2000 | Tran et al. |
| 6,128,239 A | 10/2000 | Perner |
| 6,256,224 B1 | 7/2001 | Perner et al. |
| 6,256,247 B1 | 7/2001 | Perner |
| 6,259,644 B1 | 7/2001 | Tran et al. |
| 6,331,943 B1 | 12/2001 | Naji et al. |
| 6,455,366 B1 * | 9/2002 | Lee ............................. 438/241 |

* cited by examiner

Primary Examiner—Phuc T. Dang
(74) Attorney, Agent, or Firm—Ingrassia Fisher & Lorenz PC

(57) ABSTRACT

A method for contacting an electrically conductive electrode overlying a first dielectric material of a structure is provided. The method includes forming a mask layer overlying the electrically conductive electrode and patterning the mask layer to form an exposed electrically conductive electrode material. At least a portion of the exposed electrically conductive electrode material is removed while an electrically conductive veil is formed adjacent the mask layer. A metal contact layer is formed such that said metal contact layer contacts the electrically conductive veil.

16 Claims, 2 Drawing Sheets

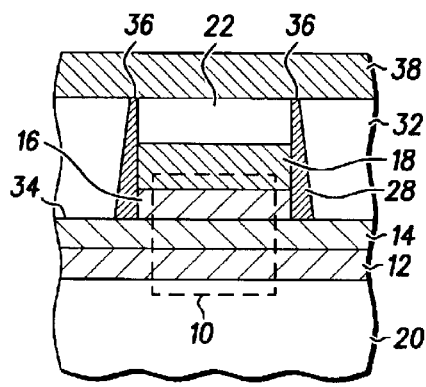
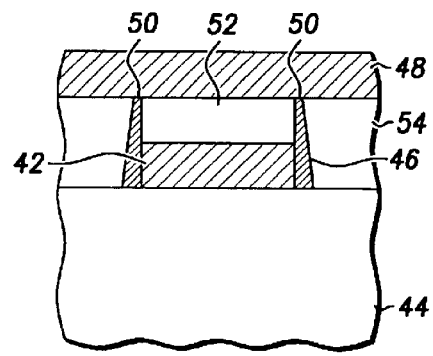
FIG. 7    FIG. 8
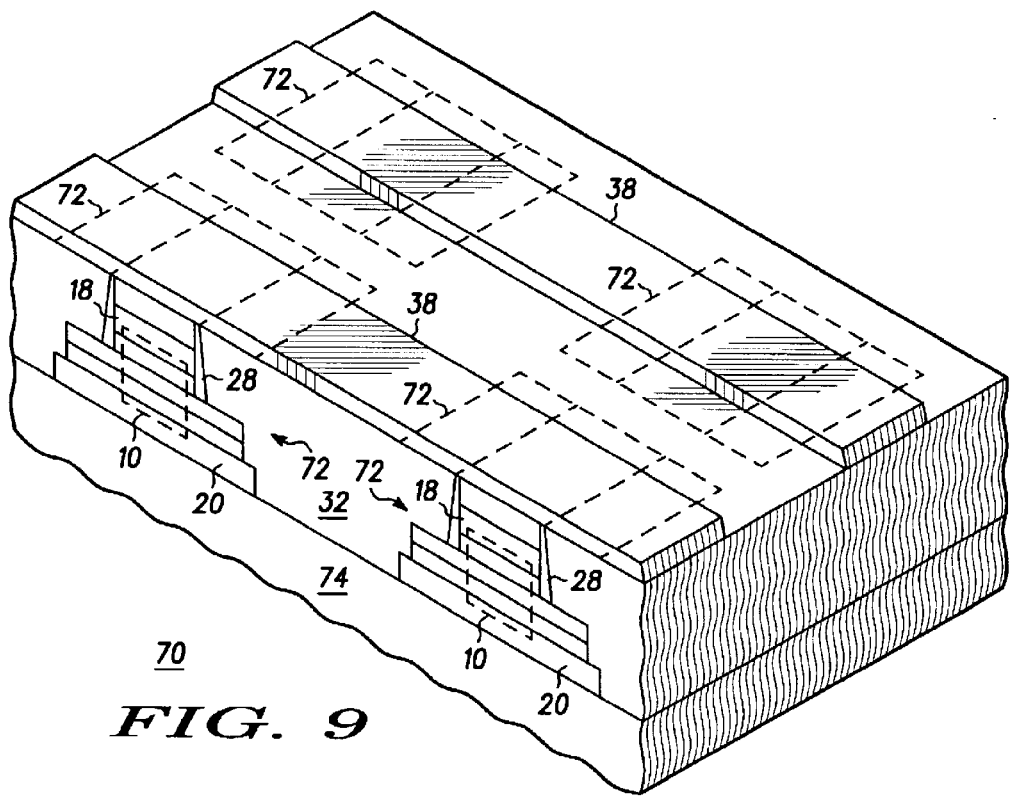
FIG. 9

METHOD AND STRUCTURE FOR CONTACTING AN OVERLYING ELECTRODE FOR A MAGNETOELECTRONICS ELEMENT

FIELD OF THE INVENTION

The present invention relates generally to magnetoelectronics devices, and more particularly to a method and structure for contacting an overlying electrode for a magnetoelectronics element.

BACKGROUND OF THE INVENTION

Magnetoelectronics devices, spin electronics devices and spintronics devices are synonymous terms for devices that use effects predominantly caused by electron spin. Magnetoelectronics effects are used in numerous information devices, and provide non-volatile, reliable, radiation resistant, and high-density data storage and retrieval. The numerous magnetoelectronics information devices include, but are not limited to, magnetic random access memory (MRAM), magnetic sensors and read/write heads for disk drives.

Generally, a magnetoelectronics information device is constructed with an array of magnetoelectronics elements (e.g., giant magneto resistance (GMR) elements or magnetic tunnel junction (MTJ) elements) that are separated by dielectric or other insulative material. Typically, electrical connection to a magnetoelectronics element is made via electrodes that overlie and underlie the element. However, inherent stress in the structure of the electrodes, particularly the overlying electrode, can adversely affect the magnetic properties of the magnetoelectronics element. Accordingly, it is preferable to make at least the overlying contact electrode as thin as possible. However, as the thickness of the overlying contact electrode decreases, the difficulty in making subsequent electrical contact to the overlying contact electrode increases. Planarization to the overlying contact electrode often results in over-planarization past the overlying contact electrode. Further, the creation of vias to the overlying electrode is difficult with present-day increases in aspect ratios and requires additional masking steps, resulting in decreased throughput and increased production costs.

Accordingly, it is desirable to provide an efficient and cost-effective method for contacting an overlying electrode for a magnetoelectronics element. It is also desirable to extend use of this method to other structures in which contact to an electrode is required. Other desirable features and characteristics of the present invention will become apparent from the subsequent description and the appended claims, taken in conjunction with the accompanying drawings.

BRIEF DESCRIPTION OF THE DRAWINGS

The following drawings are illustrative of particular embodiments and therefore do not limit the scope of the invention, but are presented to assist in providing a proper understanding. The drawings are not to scale and are intended for use in conjunction with the explanations in the following detailed description. The present invention will hereinafter be described in conjunction with the appended drawings, wherein like reference numerals denote like elements, and:

FIGS. 1–7 illustrate schematically, in cross section, a method for contacting an overlying electrode for a magnetoelectronics element in accordance with an exemplary embodiment of the invention;

FIG. 8 illustrates schematically, in cross section, a structure in accordance with an exemplary embodiment of the invention; and FIG. 9 illustrates an enlarged perspective view of a portion of a random access memory device in accordance with an exemplary embodiment of the present invention.

DETAILED DESCRIPTION OF THE DRAWINGS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims. Furthermore, there is no intention to be bound by any theory presented in the preceding background or any exemplary embodiments of the invention.

Figure 1:
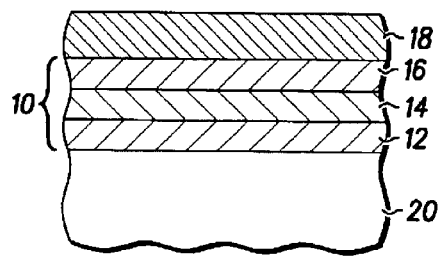

FIGS. 1–7 illustrate a method for contacting an overlying (first) electrode 18 for a magnetoelectronics element 10, which may be a giant magneto resistance (GMR) element or a magnetic tunnel junction (MTJ) element, in accordance with one embodiment of the invention. As illustrated in FIG. 1, magnetoelectronics element 10 is preferably a MTJ element having a first magnetic layer 12, a tunnel barrier layer 14 overlying first magnetic layer 12, and a second magnetic layer 16 overlying tunnel barrier layer 14. Preferably, first magnetic layer 12 is configured as a fixed magnetic layer and second magnetic layer 16 is configured as a free magnetic layer. First magnetic layer 12 overlies a second electrode 20 and first electrode 18 overlies second magnetic layer 16. While second electrode 20 is illustrated in FIGS. 1–7, it will be appreciated that second electrode 20 may not be necessary to the operation of magnetoelectronics element 10 illustrated in the figures and need not necessarily be present. The structure illustrated in FIG. 1 may be formed in any conventional manner.

First and second magnetic layers (12, 16), and any additional magnetic layers, can be formed of any number of magnetic materials, such as nickel (Ni), iron (Fe), cobalt (Co) or alloys thereof. Alternatively, first and second magnetic layers (12, 16), and any additional magnetic layers, can be a composite magnetic material, such as nickel-iron (NiFe), nickel-iron-cobalt (NiFeCo) and cobalt-iron (CoFe) or alloys thereof, for example. Tunnel barrier layer 14, and any additional tunnel barrier layers, is preferably aluminum oxide ($Al_2O_3$), but any number of insulators or semiconductors, such as aluminum nitride or oxides of nickel, iron, cobalt or alloys thereof, can be used in accordance with the present invention.

First and second electrodes (18, 20) can be formed of any suitable electrically conductive materials. Preferably, first and second electrodes are formed of tantalum (Ta), aluminum (Al), tantalum nitride (TaN) or alloys thereof. More preferably, first and second electrodes are formed of tantalum.

Figure 2:
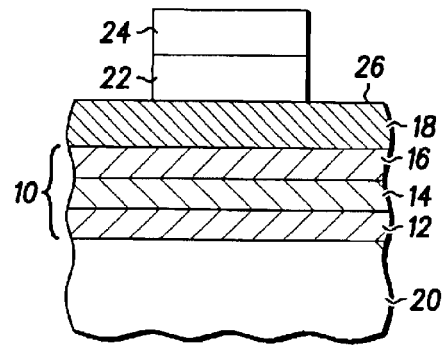

Turning now to FIG. 2, a mask layer 22 may be formed overlying first electrode 18 using standard techniques known in the semiconductor industry. Preferably, mask layer 22 is formed of a hardmask such as that comprising silicon dioxide, silicon nitride or any other suitable dielectric material. A photoresist layer 24 may be formed and developed overlying mask layer 22 using standard photolithography techniques and mask layer 22 then may be etched to expose portions 26 of first electrode 18. The etch may be a wet etch, such as an etch in hydrofluoric acid or other similar fluid, a dry etch such as in a plasma, or any other etch known in the semiconductor industry suitable for etching mask layer 22. In an alternative embodiment of the invention, mask layer 22 and photoresist layer 24 may comprise one contiguous masking layer formed of photoresist, which is patterned using standard photolithography techniques to expose portions 26 of first electrode 18.

Figure 3:
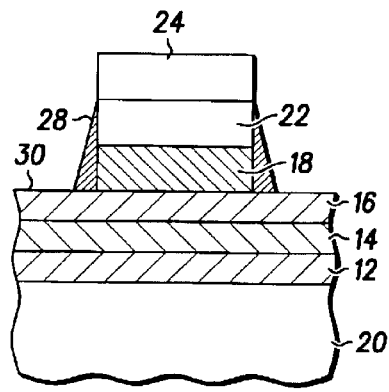

Referring to FIG. 3, exposed portions 26 of first electrode 18 are then removed preferably by plasma sputtering using standard reactive ion etching (RIE) processing using mask layer 22 as a sputter etch mask. During the sputtering process, a portion of the electrically conductive molecules released from exposed portions 26 of first electrode 18 deposits on the sidewalls of mask layer 22, thus forming an electrically conductive veil 28 in electrical contact with the remaining portion of first electrode 18. Veil 28 may also form along the sidewalls of photoresist layer 24. It will be appreciated that the amount of material comprising veil 28 can be increased or decreased by changing the reactive components of the etching process, such as for example, temperature, bias of the process, the amount of reactive gas etchant, etc., such that more or less material from first electrode 18 is released from exposed portions 26 and deposited as veil 28. It also will be appreciated that, while plasma sputtering is the preferred process for removing exposed portions 26 of first electrode 18, any suitable method for removing exposed portions 26 of first electrode 18 while also forming veil 28 along the sidewalls of mask layer 22 may also be used. Such methods may include, for example, ion milling and inert gas sputter etching.

Figure 4:
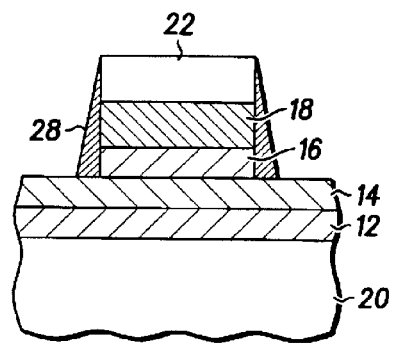

Removal of exposed portions 26 of first electrode 18 exposes portions 30 of second magnetic layer 16. As illustrated in FIG. 4, in accordance with one embodiment of the invention, exposed portions 30 of second magnetic layer 16 may be removed by any suitable method, such as, for example, ion milling or chemical or non-reactive RIE processing, using patterned first electrode 18 and veil 28 as a sputter etch mask. During the sputtering process, a portion of the electrically conductive molecules from exposed portions 30 of second magnetic layer 16 are released and may further deposit on existing veil 28 and on the sidewalls of mask layer 22, thus further growing veil 28. It is believed, however, that it may not be necessary to the principles of the invention for molecules from magnetic layer 16 to be included in veil 28, and thus veil 28 may be composed of materials different from second material layer 16.

Photoresist layer 24 then may be removed by any standard photoresist removal technique known in the semiconductor industry, as illustrated in FIG. 4. If mask layer 22 and photoresist layer 24 are both formed of photoresist, as in one continuous layer of photoresist, upon removal of the photoresist, veil 28 will, in effect, from a hollow "well" with first electrode 18 as its base.

It will be appreciated that, in a preferred embodiment of the invention, exposed portions 30 of second magnetic layer 16 are completely removed, as illustrated in FIG. 4. In an alternative embodiment of the invention, the sputter etch process may be terminated before etching through the entire thickness of second magnetic layer 16 so that a residual amount of exposed portions 30 of second magnetic layer 16 remains. In this embodiment, the residual amount of exposed portions 30 of second magnetic layer 16 may be oxidized using any suitable method known in the semiconductor industry. During the oxidation of second magnetic layer 16, photoresist layer 24 also is removed by the oxidation.

Figure 5:
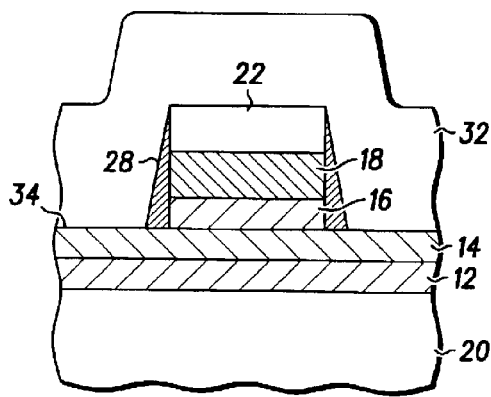

Referring to FIG. 5, a dielectric material layer 32 may then be formed overlying veil 28, any exposed mask layer 22, and remaining exposed portions 34 of magnetoelectronics element 10. It will be appreciated that if mask layer 22 was formed of photoresist and had been earlier removed such that veil 28 formed a hollow "well," dielectric material layer 32 would now fill the well. Dielectric material layer 32 may be formed of any suitable dielectric material such as, for example, plasma-enhanced oxide, nitride and the like. Preferably, dielectric material layer 32 is formed by plasma-enhanced chemical vapor deposition (PECVD), although dielectric material layer 32 may be formed by any other suitable process such as physical vapor deposition (PVD), chemical solution deposition (CSD), pulsed laser deposition (PLD), and the like.

Figure 6:
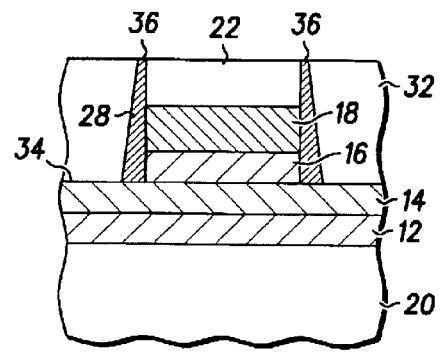

As illustrated in FIG. 6, a portion of the dielectric material layer 32 is then removed to expose an area 36 of veil 28. A sufficient area 36 of electrically conductive veil 28 should be exposed so that a subsequently formed metal contact, discussed in more detail below, can make electrical contact with first electrode 18 via veil 28, as veil 28 extends along the sidewalls of mask 22 (or "well" of dielectric, as the case may be) to first electrode 18. Dielectric material layer 32 may be removed by chemical mechanical planarization (CMP), etching, sputtering or any other suitable method. Preferably, a substantial first thickness of dielectric material layer 32 is removed by CMP and then a second thickness of dielectric material layer 32 is removed by sputtering using standard techniques known in the semiconductor industry to achieve a desired residual thickness of the layer.

Turning now to FIG. 7, electrical contact to overlying first electrode 18 is completed, in accordance with one embodiment of the invention, by depositing a metal contact layer 38 overlying dielectric material layer 32 and contacting exposed areas 36 of electrically conductive veil 28. Metal contact layer 38 can be suitably patterned in any known manner to form the desired electrode pattern. Metal contact layer 38 may be formed of any suitable conductive metal such as copper (Cu), aluminum (Al) and the like. As described above, metal contact layer 38 is electrically coupled to first electrode 18 via electrically conductive veil 28, which extends between metal contact layer 38 and first electrode 18.

It will be appreciated that the principles of the present invention are not limited to magnetoelectronics structures but may also be used for contacting a first electrically conductive electrode of any structure having a first electrically conductive electrode overlying a dielectric material. In accordance with another exemplary embodiment of the present invention, FIG. 8 illustrates an electronic structure 40 formed using the various embodiments of the method described above. Structure 40 includes an electrically conductive electrode 42 overlying a first dielectric material layer 44. Electrically conductive electrode 42 can be formed of any material suitable for a particular application. Electrical contact to electrode 42 is achieved by a metal contact layer 48, which is electrically coupled to electrically conductive electrode 42 by an electrically conductive veil 46. Veil 46 is formed by removing exposed portions of electrode 42 using a mask layer 52 as a sputter etch mask. Metal contact layer 48 may be formed of any of the materials comprising metal contact layer 38 as described with reference to FIG. 7. Metal contact layer 48 contacts veil 46 at exposed areas 50, which are of sufficient areas so that electrical contact with electrode 42 is achievable. A second dielectric material layer 54 may overlie first dielectric material layer 44 and insulate veil 46.

FIG. 9 illustrates an enlarged perspective view of a portion of a random access memory device 70 in accordance with another exemplary embodiment of the present invention. Elements of FIG. 9 that have the same reference numbers as FIG. 7 are the same as the corresponding FIG. 7 elements. Random access memory device 70 includes a plurality of magnetic memory units 72 that are each electrically coupled to a metal contact layer 38. The magnetic memory units 72 may be formed on any suitable substrate 74, which may include any suitable semiconductor devices (not shown) such as, for example, switching transistors, bit and/or data lines, input/output circuits, data/address decoders, and the like.

Each magnetic memory unit 72 includes a first electrode 18, a magnetoelectronic element 10 underlying first electrode 18, a second electrode 20 underlying magnetoelectronic element 10, and an electrically conductive veil 28. Electrically conductive veil 28 electrically couples first electrode 18 to metal contact layer 38. A dielectric material layer 32 is formed to cover the exposed portions of substrate 74, the exposed portions of magnetoelectronic element 10 and electrically conductive veil 28. Accordingly, when an electric current is applied to metal contact layer 38, it may flow from metal contact layer 38 to first electrode 18, then through magnetoelectronics element 10 to second electrode 20 and on to any other electrical path as provided for in substrate 74.

From the foregoing description, it should be appreciated that a method for contacting an overlying electrode for a magnetoelectronics element is provided that presents benefits that have been presented in the foregoing background and description and also presents benefits that would be apparent to one skilled in the art. Furthermore, while a preferred exemplary embodiment has been presented in the foregoing description, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

What is claimed is:

1. A method for contacting an electrically conductive electrode overlying a first dielectric material of a structure, the method comprising the steps of:
    forming a mask layer overlying the electrically conductive electrode;
    patterning said mask layer to form an exposed electrically conductive electrode material;
    removing at least a portion of said exposed electrically conductive electrode material while forming an electrically conductive veil adjacent said mask layer; and
    forming a metal contact layer such that said metal contact layer contacts said electrically conductive veil.

2. The method of claim 1, wherein the step of forming a musk layer comprises forming a hardmask formed of one of silicon dioxide and silicon nitride.

3. The method of claim 1, wherein the step of forming a mask layer comprises forming a photoresist layer.

4. The method of claim 1, further comprising the steps of forming and developing a photoresist layer overlying said mask layer before the step of patterning.

5. The method of claim 1, wherein the step of removing at least a portion of said exposed electrically conductive electrode comprises removing by one of ion milling, inert gas sputter etching and reactive ion etching.

6. The method of claim 1, wherein, before the step of forming a metal contact layer, the method further comprises the steps of;
    forming a second dielectric material layer overlying said electrically conductive veil and a remaining exposed portion of said structure; and
    removing a portion of said second dielectric material layer to expose an area of said electrically conductive veil sufficient for electrical contact.

7. A method for contacting an electrode for a magnetoelectronics element that is electrically connected to the electrode the magnetoelectronics element having a first magnetic layer overlying a tunnel barrier layer that overlies a second magnetic layer, the method comprising the steps of;
    forming a mask layer overlying the electrode;
    patterning said mask layer to form an exposed electrode material;
    removing at least a portion of said exposed electrode material while forming an electrically conductive veil adjacent said mask layer;
    forming a dielectric material layer overlying said electrically conductive veil; and
    removing a portion of said dielectric material layer to expose an area of said electrically conductive veil sufficient for electrical contact.

8. The method of claim 7, further comprising the step of forming a metal contact layer overlying said dielectric material layer, said metal contact layer contacting said electrically conductive veil.

9. The method of claim 7, wherein the step of removing at least a portion of said exposed electrode material forms an exposed first magnetic layer material and further comprising the step of removing at least a portion of said exposed first magnetic layer material.

10. The method of claim 9, wherein the step of removing at least a portion of said exposed first magnetic layer material forms a residual exposed first magnetic layer material and further comprising the step of oxidizing said residual exposed first magnetic layer material before the step of forming a dielectric material layer.

11. The method of claim 7, wherein the step of forming a mask layer comprises forming a hardmask of one of silicon dioxide and silicon nitride.

12. The method of claim 7, wherein the step of forming a mask layer comprises forming a photoresist layer.

13. The method of claim 12, further comprising the step of removing said mask layer before the stop of forming a dielectric material layer.

14. The method of claim 7, further comprising the steps of forming and developing a photoresist layer overlying said mask layer before the step of patterning.

15. The method of claim 9, wherein the step of removing at least a portion of said exposed first magnetic layer comprises forming an electrically conductive veil that comprises material from both the electrode and the first magnetic layer.

16. The method of claim 7, wherein the step of removing at least a portion of said exposed electrode material comprises removing by one of ion milling, inert gas sputter etching and reactive ion etching.

* * * * *

UNITED STATES PATENT AND TRADEMARK OFFICE
CERTIFICATE OF CORRECTION

PATENT NO. : 6,806,127 B2 Page 1 of 1
APPLICATION NO. : 10/309514
DATED : December 3, 2002
INVENTOR(S) : Brian R. Butcher It is certified that error appears in the above-identified patent and that said Letters Patent is hereby corrected as shown below:

In Column 6, Line 51, Claim 13:
  Change "before the stop of forming" to --before the step of forming--

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,806,127 B2  
APPLICATION NO. : 10/309514  
DATED : October 19, 2004  
INVENTOR(S) : Brian R. Butcher Page 1 of 1

It is certified that error appears in the above-identified patent and that said Letters Patent is hereby corrected as shown below:

In Column 6, Line 51, Claim 13:
    Change "before the stop of forming" to --before the step of forming--

This certificate supersedes the Certificate of Correction issued May 27, 2008.

Signed and Sealed this

Twenty-fourth Day of June, 2008

JON W. DUDAS  
*Director of the United States Patent and Trademark Office*